United States Patent [19]

Wondergem et al.

[11] 4,395,762

[45] Jul. 26, 1983

[54] FREQUENCY COUNTER

[76] Inventors: Hendrik M. Wondergem, Ste. 1903, 265 Balliol St., Toronto, Ontario, Canada, M4S 1C9; Robert J. Kaldenbach, 5 Denham Dr., Thornhill, Ontario, Canada, L4J 1N5

[21] Appl. No.: 234,994

[22] Filed: Feb. 17, 1981

[30] Foreign Application Priority Data

Oct. 28, 1980 [CA] Canada .................................. 363389

[51] Int. Cl.³ ........................ G06F 15/36; G01R 23/02
[52] U.S. Cl. ................................. 364/484; 324/78 D; 364/554
[58] Field of Search ............... 364/484, 551, 554, 575, 364/701, 734; 235/92 FQ; 324/78 R, 78 D, 78 Z, 79 D

[56] References Cited

U.S. PATENT DOCUMENTS

| 2,992,384 | 7/1961 | Malbrain | 324/78 |
|---|---|---|---|
| 3,693,097 | 9/1972 | Band | 328/39 |
| 3,732,405 | 5/1973 | Stewart | 364/484 |
| 3,938,042 | 2/1976 | Gliever et al. | 324/78 D X |
| 4,027,146 | 5/1977 | Gilmore | 235/151.31 |
| 4,093,850 | 6/1978 | Karnowski et al. | 364/701 X |
| 4,150,432 | 4/1979 | Sorden | 364/484 |
| 4,162,443 | 7/1979 | Brearley et al. | 324/78 D |
| 4,224,568 | 9/1980 | Griner | 324/78 D |
| 4,310,795 | 1/1982 | Fremery | 324/78 D |

FOREIGN PATENT DOCUMENTS 618762  4/1961  Canada .

Primary Examiner—Jerry Smith
Attorney, Agent, or Firm—Ridout & Maybee

[57] ABSTRACT

A frequency counter having particular utility for processing the output of proton precession magnetometers divides a signal to be counted into a large number of consecutive elements each of an integral number of half cycles, and counts the increment in total elapsed duration of the signal represented by each sample. The counts are stored, and the stored counts are then manipulated to provide a least squares approximation of their mean, and the standard deviation of that mean. The counter can provide enhanced accuracy, as well as an indication of the reliability of the readings obtained.

13 Claims, 4 Drawing Figures

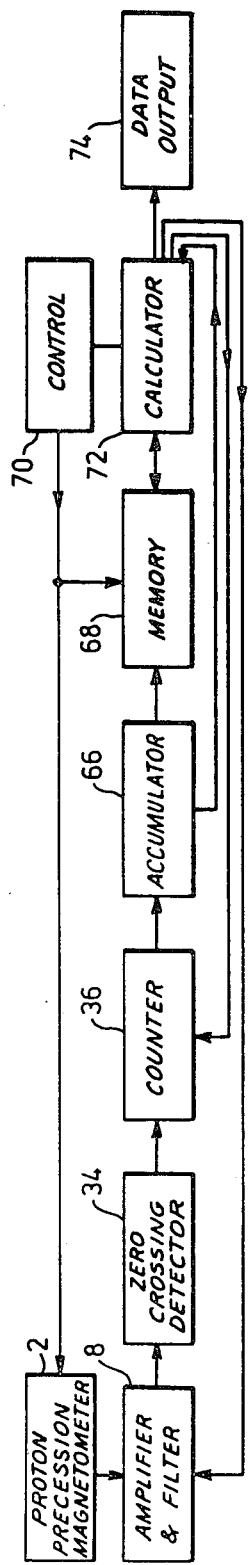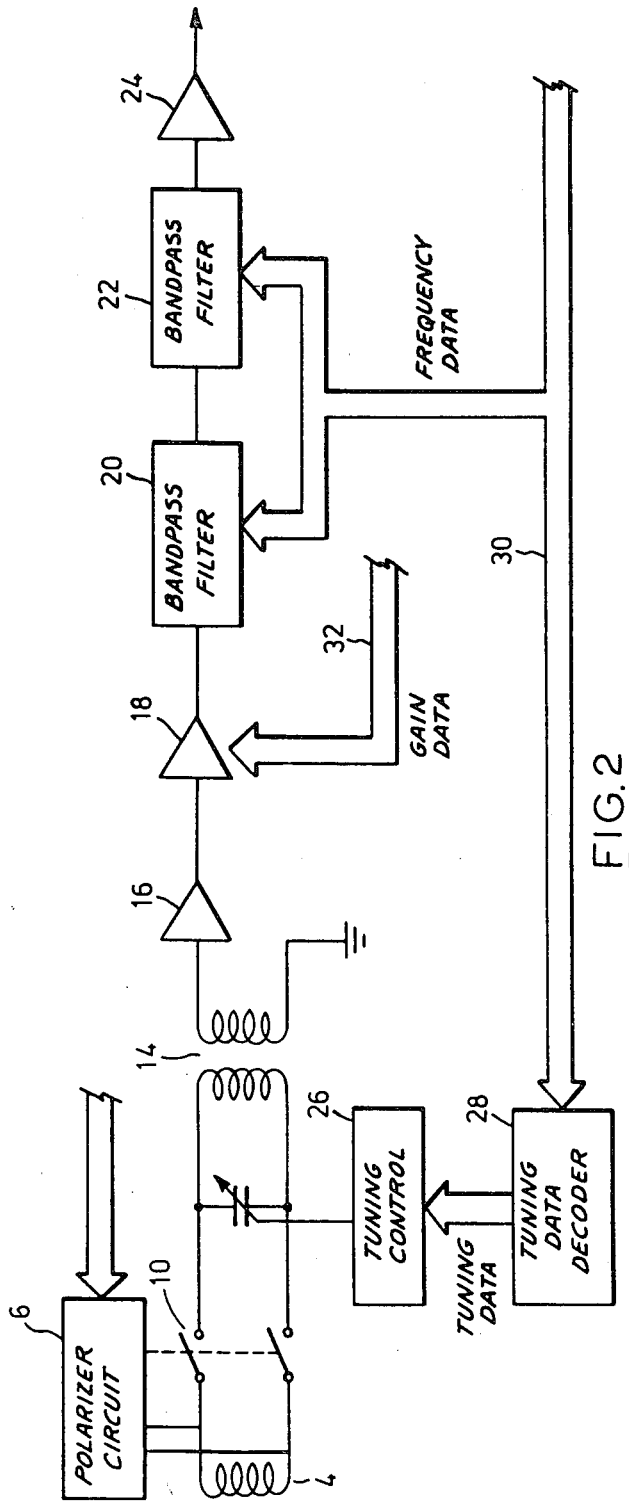

FREQUENCY COUNTER

FIELD OF THE INVENTION

This invention relates to the measurement of the frequency or periodicity of a cyclical signal.

BACKGROUND OF THE INVENTION

Conventional frequency counters operate by gating a cyclical signal for a predetermined period and counting the number of cycles during that period. This basic method is not reliable when the signal is seriously noisy or otherwise impaired and/or is of limited duration. In order to measure the frequency of such signals, it has become customary to use the signal to lock a phase-locked loop and to measure the loop parameters rather than the signal parameters in order to determine the periodicity of the latter. This method is capable of giving greatly improved results with a noise impaired signal, but still possesses some disadvantages, particularly with signals of limited duration.

One common type of input signal consists of individual bursts of oscillation with a rapid attack and a slow exponential decay. Such a signal is for example provided by proton precession magnetometers, the accuracy of such a magnetometer being commonly determined by the accuracy with which the frequency of the output can be ascertained. If a phase-locked loop is locked to such a signal, the locking process commences during the initial portion of the burst when its amplitude is highest, but before the locking process is completed, the signal amplitude will have dropped substantially and the influence of any noise present in the signal will be proportionately increased. Such noise may either prevent locking or render it impossible to be certain that locking was achieved. In any event, it is impossible to use the highest amplitude portion of the signal for measurement purposes, thus resulting in a significant diminution in both the length and the quality of the signal sample available. Further problems can occur when the quality or strength of the signal fluctuates or changes, so that locking is only achieved very briefly. In such cases, the accuracy of the result may be significantly impaired, but there may be nothing to indicate the quality of the signal upon which the measurement was made.

Difficulties may also arise where the signal contains components at closely adjacent frequencies such as to produce a beat effect. This will affect locking of the loop since the signal strength will fluctuate at the beat frequency and may thus fall below the level at which locking can be achieved after a short period quite unrelated to the duration of the signal.

Obviously, when dealing with an impaired signal of limited duration, it is important that the phase-locked loop is tuned as closely as possible to the frequency of the signal to which it is to be locked, and this is a further disadvantage of the arrangement in that the locking time will depend on the accuracy of the tuning.

SUMMARY OF THE INVENTION

An object of the present invention is to provide a frequency counting system for impaired or burst signals which can make use of the whole usable portion of a signal sample, which can be of high resolution and accuracy, and which can provide an indication of the reliability of its measurements.

According to the invention, there is provided apparatus for determining the frequency of a cyclical component of a signal, comprising a signal source, filter means for receiving said signal and isolating said component, means for receiving said isolated component and dividing it at predetermined points in its cycle whereby to divide it into elements comprising an integral number of half cycles, an elapsed time counter receiving said elements and outputting successive counts defining increments in total elapsed time corresponding to the successive elements, memory means receiving and storing said counts, a statistical calculator operative to receive said sequence of stored counts and provide an output proportional to a statistical mean increment in total elapsed time, and read-out means operative to receive said output and provide a read-out of the frequency or period of said cyclical component of said signal. Preferably the statistical calculator is operative to determine a statistical mean increment such as to minimize the sum of the squares of the residuals of said successive total elapsed times as counted to the end of each element with respect to the corresponding incremental total elapsed times calculated on the basis of said mean. Preferably the statistical calculator is also operative to output the standard deviation of said times as counted from said mean, and said read-out means is operable to provide a read-out of said standard deviation. In a preferred arrangement the filter means is a band-pass filter tunable in response to a control signal, and said output of said calculator provides said control signal. Typically, the signal source is a proton precession magnetometer.

SHORT DESCRIPTION OF THE DRAWINGS

In the drawings:

FIG. 1 is a simplified block diagram of a proton precession magnetometer embodying the present invention;

FIGS. 2, 3 and 4 together form a more detailed block diagram of the magnetometer of FIG. 1, FIG. 2 showing an analogue signal processing portion of the circuit, FIG. 3 showing a counter portion, and FIG. 4 showing a data processing portion.

DESCRIPTION OF THE PREFERRED EMBODIMENT

Figure 3:
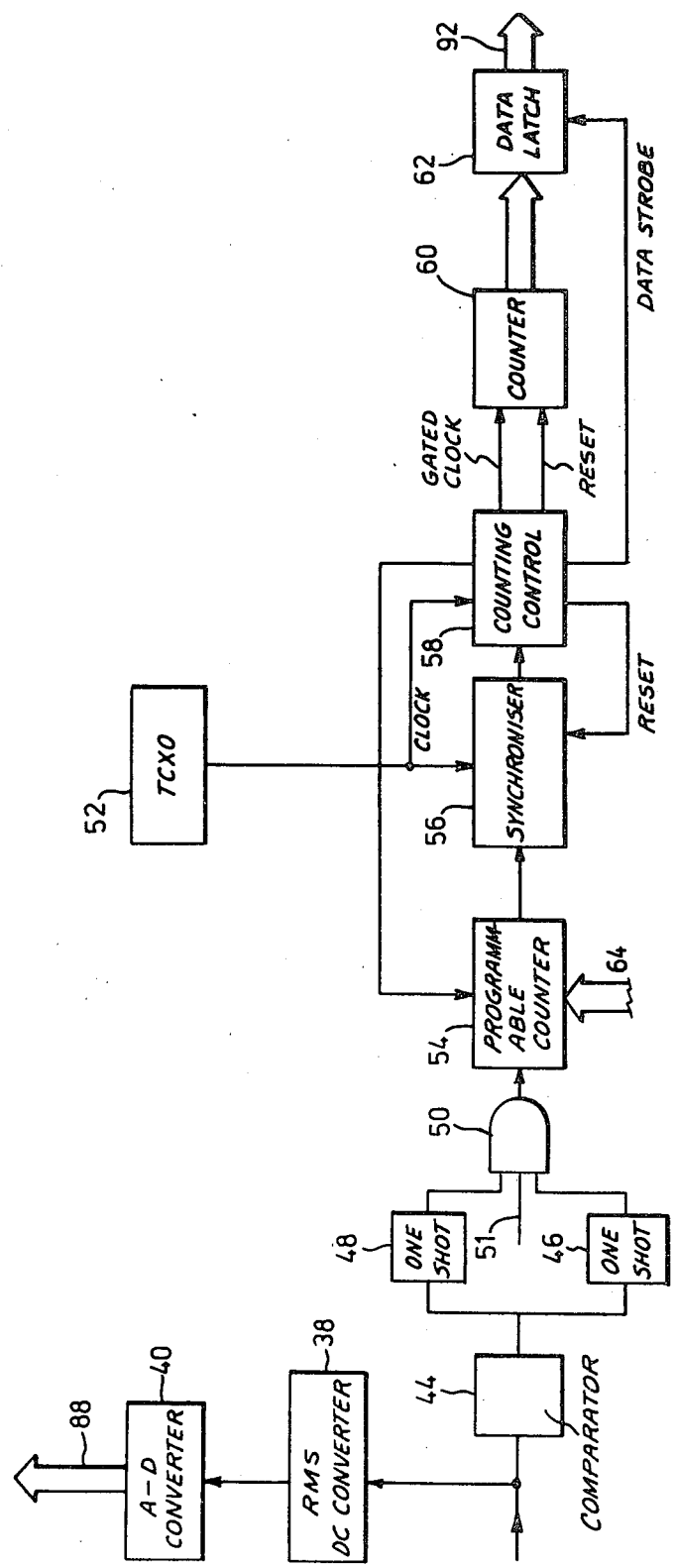

Referring to FIG. 1, the block 2 indicates a proton precession magnetometer, the construction of which forms no part of the invention and may vary according to the intended application of the magnetometer. It consists (see FIG. 2) essentially of a coil 4 by means of which current from a polarizer circuit 6 can be used to apply a powerful polarizing field to a sample of a liquid hydrogen compound such as water or a hydrocarbon or alcohol. When this polarizing field is removed, the protons in the sample precess and induce in the coil 4 an alternating signal current characterized by a frequency proportional to the strength of the residual field to which the sample is subject, this typically being the earth's magnetic field. This signal, the frequency of which at typical field strengths may range from 800 to 4000 Hz, decays fairly rapidly over a period typically of 0.5 to 2 seconds.

During precession, the signal from the magnetometer 2 is applied to an amplifier and filter unit 8 by means of a switch 10 associated with the polarizer circuit. Referring to FIG. 2, this unit may comprise a tunable LC filter represented schematically by the variable capacitance 12 and the coil 4 together with a small element due to the primary of a transformer 14, a low noise preamplifier 16 receiving the signal from the secondary of transformer 14, and a programmable gain amplifier 18 passing the signal to two adjustably stagger-tune band-pass filters 20, 22 in series before final amplification by output amplifier 24. The capacitance 12 is adjusted by a tuning control unit 26, and in practice may consist of a bank of capacitors, a combination of which are selected by means of solid state switches, typically field effect transistors having very low drain-source resistance in the on state. The transistors may be controlled by digital data received from a tuning data decoder 28 which uses digitally coded frequency data on a line 30 to read a preprogrammed look up table and transmit data operative to cause selection of an appropriate capacitance value. The frequency data is also utilized to provide digital control of the centre frequencies of the band-pass filters. The gain of the amplifier 18 is also controlled digitally by data received on a line 32 so as to control the amplitude of the output of amplifier 24 to a desired level. The generation of the data appearing on lines 30 and 32 is discussed further below.

The output signal from the amplifier and filter unit 8 is applied to a zero crossing detector 34 and a counter 36 which are comprised by a counter unit shown in more detail in FIG. 3. The counter unit also includes an RMS/DC converter 38 and analog-digital converter 40 to derive a digital output on a line 42 proportional to the amplitude of the signal from the unit 8. The zero crossing detector may be formed as shown in FIG. 3 by a comparator 44 followed by one-shot multivibrators 46 and 48 triggered respectively by the positive and negative going transitions of the comparator output, to produce pulse trains which are combined by an AND gate 50 to provide a pulse at the end of each half cycle of the signal. The AND gate 50 has another input 51 by which it is strobed, as discussed further below, so as only to pass pulses occurring during the usable portion of the input from the magnetometer.

These pulses are applied to the counter 36, which may comprise, as shown in FIG. 3, an accurate time base in the form of a temperature compensated crystal oscillator 52, a prescaler in the form of a programmable counter 54, a synchronizer 56, a counting control unit 58, a counter 60 and a data latch 62. The counter 54 is programmed as further discussed below so as to bring the frequency of its output pulses to a convenient level within a fairly narrow range, e.g. if the frequency of the input of the zero crossing detector is 2 kHz then the frequency at the counter input will be 4 kHz and the counter may be programmed to divide by 4 to provide an output frequency of 1 kHz. If the input frequency is 500 Hz then the counter may be programmed to divide by 1, thus still providing an output at 1 kHz. The output of the programmable counter is applied to the synchronizer 56 which may be implemented by a flip-flop which when set by the appearance of a pulse at the output of the counter 54 inserts bits into a serial-to-parallel shift register comprised by the counting control unit and by the oscillator 52. Outputs are taken from selected stages of the shift register so that when inserted bits reach the selected stages they provide outputs which first inhibit the application of clock pulses to the ripple counter 60 for a sufficient time to allow ripple-through in the counter to be completed, then strobe the data latch 62 to transfer the count from the counter thereto, reset the counter, and finally reset the synchronizer flip-flop. A further output also reloads the counter 54 in accordance with the program applied thereto on line 64. This synchronizing procedure ensures that the only clock pulses lost are a number in each count sequence predetermined by the count control; since the number of missing pulses is precisely known, their absence can be allowed for in subsequent data processing. The total of successive count sequences is therefore precisely related to the total elapsed time since the beginning of the first count without any cumulative error. Similar results could be obtained by using a fully synchronous counter but the maximum clock rate which could be used when implementing the circuit with any given family of integrated circuits would probably be decreased and/or the power consumption would be increased, an important consideration in portable instruments. The essential requirement is that the cycle length of the input to the counter 36 is determined on the basis of increments in elapsed time, rather than the length of each cycle being determined as an independent operation. A synchronous or synchronized counting of the cycle length is therefore required to avoid the possibility of cumulative errors in the total length of the periods counted.

The clock rate in a typical application may be 2.5 MHz, which with a pulse repetition rate of about 1 kHz means a count of approximately 2500 for each cycle. This requires the counter 60 to be a 12 bit counter with a maximum count of 4096.

Referring again now to FIG. 1, the typically twelve bit data words representing successive counts by the counter unit 36 are passed through an accumulator 66 containing registers in which the counts are respectively accumulated to provide a total elapsed time count, and tallied to register the number of counts. The counts are then passed to the memory 68. The memory is cleared before each measurement by a signal from a control unit 70 which also controls the switching of the polarizing current to the magnetometer 2 and initializes a statistical calculator 72 to operate upon data stored in the memory 68. The primary function of the calculator is to arrive at a statistical mean such as to minimize the variance of the total elapsed time at the end of each of the time increments measured by the counter 36, and from that mean to calculate the frequency or periodicity of the signal from the magnetometer 2, making allowance for the fact that the time increments counted will represent the period of an integral number of half cycles of the original signal, when adjusted by any constant necessary to allow for the counts lost in the operation of the synchronizer 56. In practice, it is cumbersome to calculate in terms of total elapsed times because of the very large numbers involved. In order to reduce the volume of data to be handled a total elapsed time count representing the sum of the time increments counted and a count of the number of time increments are accumulated in the accumulator 66 and passed to the calculator in which the total elapsed time count is divided by the number of time increments to give an average which provides a first approximation of the mean increment. The residuals of the successive total elapsed times represented by the ends of the counted time increments with respect to the corresponding total elapsed times calculated on the basis of the average so determined are then calculated and stored in the memory to provide the data base upon which a least squares approximation of the mean time increment is then performed. A calculation of the standard deviation, variance or probable error of the counted increments with respect to the calculated mean is also performed. The frequency so calculated is used to reset the tuning of the filter sections of the filter and amplifier 8. The calculated frequency and the standard deviation or other related indication of the reliability of the frequency readings are applied to data output 74 for display and/or recording.

Figure 4:
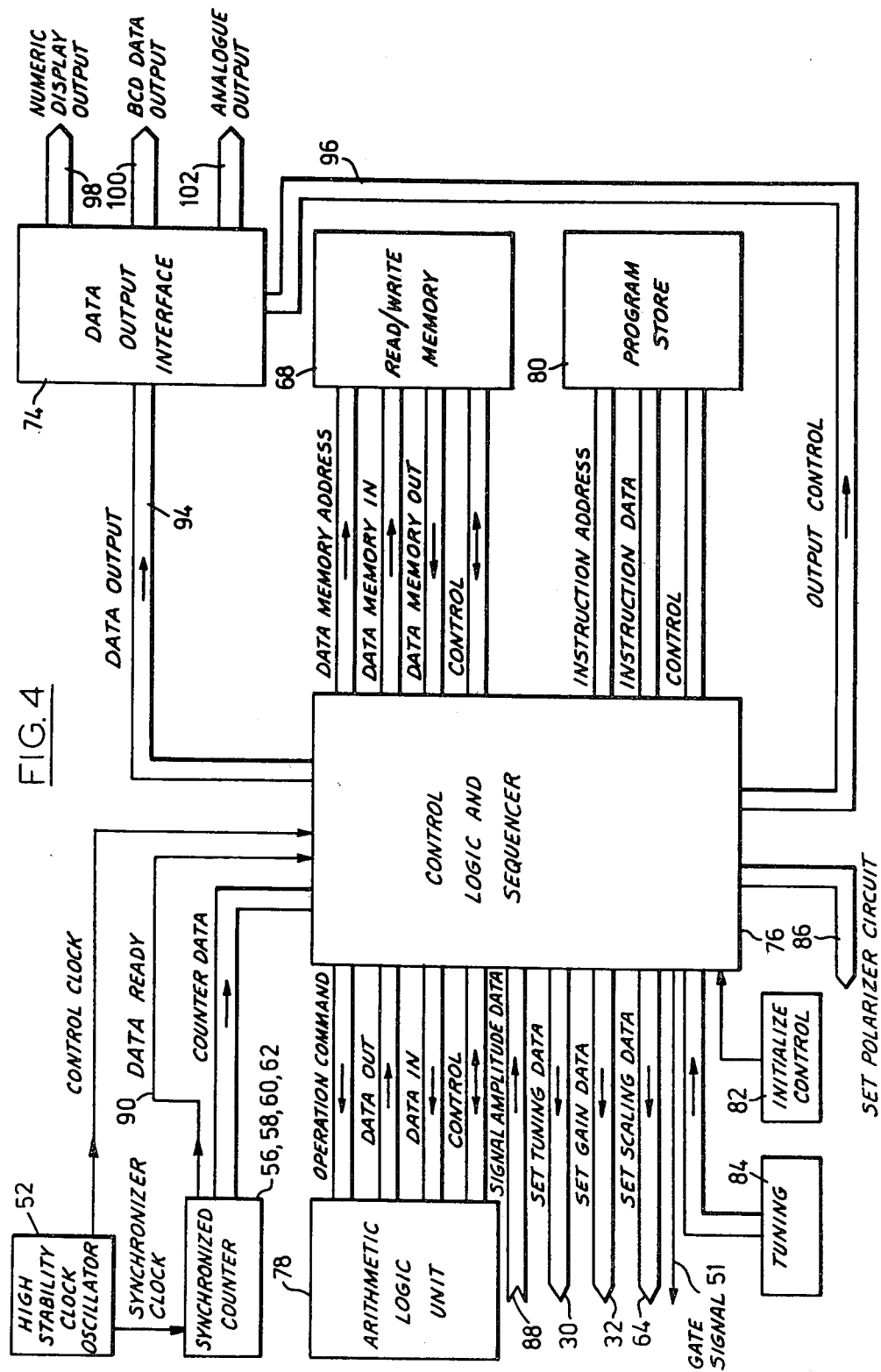

In practice, it is convenient to implement the data processing portions of the equipment by means of a data processor as shown in FIG. 4, the function of the accumulator 66, the calculator 72, and the control unit 70 being performed in a time shared fashion together with various other functions as described below.

The data processor comprises a central processing unit having a control logic and sequencer unit 76, an arithmetic logic unit 78 and a program store 80, which may be implemented by those familiar with the art using conventional readily available microprocessor chip sets which can be programmed according to conventional techniques to provide the necessary functions. Indeed, the functions required are available in preprogrammed off-the-shelf statistical calculator chips although in practice such chips would probably not provide fast enough processing of the data, and an appropriately programmed general purpose microprocessor will provide better results as well as supervising operation of the instrument as a whole.

The processor is probably best understood by describing its operation. Assuming that it is desired to initiate a series of magnetometer readings, an initializing control 82 is used to initialize the processor and set the program running, the control clock for the processor being provided by the oscillator 52. A first function of the processor is to act as a timer controlling the polarizer circuit by means of signals on a line 86 so as to apply and remove polarizing current to and from the magnetometer at appropriate intervals. A tuning control 84 is used initially to enter an expected magnetometer output frequency into the processor which in turn transmits tuning data to the filters on line 30, scaling data on the line 64 to the prescaling counter 54 on the basis of the magnitude of the frequency entered, and gain data to the amplifier 18 on line 32, again on the basis of the magnitude of the frequency selected since lower frequencies require higher gain. Any necessary calculation is carried out by the logic unit 78 under control of the sequencer 76 and the programs from store 80. When a signal on line 86 to the polarizer control turns off the polarizing current and applies the signal from coil 4 to the filter and amplifier 8, the program provides for a gate signal to be applied to line 51 after a short delay, typically 20 ms, in order to allow time for switching transients to die out before the signals from the zero crossing detector 34 are allowed to pass through the gate 50 to the counter. The signal on line 51 is inhibited unless the input data on line 88 from the A/D converter indicates that the filtered signal exceeds a predetermined level. The data on line 88 must represent a signal amplitude above a certain threshold for a signal to appear on line 51. Once the gate 50 starts passing pulses from the zero crossing detector to the counter, the counter 60 will accumulate counts proportional to the time increments between successive pulses from the prescaler counter 54 and these counts will be successively transferred to the data latch 62. Arrival of data in the data latch 62 will cause a "data ready" signal to appear on line 90 and condition the processor to receive the data on line 92. The unit 76 operating in conjunction with the ALU 78 and under the control of the program from store 80 will adjust the incoming counts to allow for the clock pulses lost in each count sequence and will then store the data in the memory 68, and will also cause both the number of incoming counts and their accumulated total to be stored in its working registers or in the memory. At the end of the sequence of counts or after a predetermined number of counts, the accumulated total is divided by the accumulated number of counts to arrive at an average count length representing an average time increment. The words representing successive time increments are stored in the memory 68 until the line 51 is inhibited, typically after 200 to 400 counts. If less than a predetermined number, for example 20, of increments have been counted, the processor may be programmed to reject the reading as being unlikely to provide useful information.

After storage of the counts is completed and their average length has been calculated, each stored count is recalled from the memory in sequence and caused to increment a register which is also decremented by the previously calculated average so that the state of the register after each stored count has been operated upon represents the difference between the total elapsed duration of the signal as measured by the counter and that arrived at on the basis of the calculated average. The accumulated difference or residual remaining after the processing of each count is stored in the memory. When all the counts have been processed and the differences stored, the processor is programmed to carry out a least squares approximation of the statistical mean of the differences, which is then added to the initially calculated average to arrive at the statistical means increment in elapsed time, i.e. a count such as to minimize the sum of the squares of the residuals of the total elapsed times as counted to the end of each element with respect to the corresponding incremental elapsed times calculated on the basis of said mean increment.

By working on the differences between accumulated counts representing successive measured elapsed times and accumulated counts representing successive elapsed times calculated on the basis of an initial average time increment, the magnitude of the numbers upon which the processor is required to operate during the least squares approximation is enormously reduced, particularly when, as is usually the case, the difference between the average and the least squares approximation is small. The possibility of a difference arises because the initial averaging step is based on the total elapsed time of the entire count sequence and takes no account of the uncertainty in the total elapsed time of this sequence arising from displacement by noise or interference of these zero crossings of the signal which commence and end the signal. These uncertainties limit the accuracy which can be obtained by averaging when operating on a signal of finite duration. The method of the invention makes use of the additional data provided by the incremental total elapsed time data available for the end of each count in the sequence so as to provide a statistical basis for quantifying the error due to any displacement of the beginning and end of the sequence, this quantification being represented by the difference between the average and the least squares approximation of the time intervals represented by the successive counts.

The calculated mean time increment is multiplied by two and divided by the same integer as that programmed into the counter 54 to arrive at the periodicity of the magnetometer output, which principal output may be applied by line 94 to the data output interface, either directly or after conversion into a frequency or magnetic field strength data. On the basis of the mean time increment, the outputs on the line 30, 32 and 64 are also adjusted if necessary prior to the next reading to provide automatic adjustment of the tuning and gain and of the prescaling ratio to provide automatic ranging.

The stored residuals may be further processed to calculate the probable error, variance or standard deviation of the principal output, the result of which calculation is also supplied to the data output, under control of the line 96. The data may be output to a numerical display on line 98, as BCD (binary coded decimal) data on line 100, or as an analogue output on line 102.

Further information is available from study of the stored residuals. Thus these residuals may be output through analogue output line 102 of the data output interface 74 and plotted in analog form. Study of this plot can provide much useful information. The gradient of the plot can indicate the direction and rate of any change in field strength during the reading. Frequency or phase modulation of the signal by low frequency interference such as that due to electric power transmission lines will show upon the plot, as will disturbances resulting from the allowance of inadequate settling time before enabling counting. The number of increments timed shows the duration of the usable portion of the signal and may indicate the presence of beat signals or serious interference. In effect, each time increment counted provides a separate reading, and although the individual reliability and accuracy of any one of these readings is low, their large number makes possible statistical analysis providing a result of high and assessable accuracy. Not only is it found that the apparatus of the invention can provide much greater accuracy in proton precession magnetometers than is possible with phase-locked loop frequency counters, but the reliability of each reading is known and the variation of the signal during the reading may be studied to provide additional information.

It will of course be appreciated that similar techniques may be applied to other frequency counting applications where the frequency to be counted is available only in bursts and/or in noise impaired conditions.

It will further be appreciated that the apparatus could be simplified as compared with that described by substituting manual tuning of the filters for the automatic digital tuning described, as well as providing manual programming of the prescaler and a simplified gain control system. The data processor could be simplified but would be rendered inconveniently slow for many applications by transferring the data from the counter to a general purpose statistical calculator for carrying out therein the least squares approximation and the calculation of the standard deviation of the result.

It is not essential to reduce the count data stored in the memory by comparing the accumulated counted elapsed time with an elapsed time calculated on the basis of average count length. A similar but probably less effective reduction could be achieved by carrying out comparison with an estimated count length or a count length arrived at during a previous reading, with the same ultimate result. Alternatively, the least squares approximation could be carried out without any reduction of the stored data but in most cases the data handling and storage capacity required in the processor would be excessive, and the time required for calculation would be greatly increased.

The counter described carries out a continuous sequence of counts each representing successive increments in total elapsed time. The counter could however count total elapsed time directly, the state of the count being read and transferred to the memory at the end of each signal element.

It will be plain from the foregoing description that an essential feature of the invention is the use of data as to the temporal location of intermediate events within a series of periodic events in a signal sample of finite duration. By accumulating sufficient data to identify the duration of and number of events in a plurality of overlapping sequences of events within the signal sample, statistical methods can be applied to the data so as greatly to reduce inaccuracies introduced due to uncertainties in the temporal location of the beginning and end of any one sequence. It will be understood therefore that the invention enables improved resolution to be obtained when measuring the periodicity of a signal sample of finite length even in the absence of impairment by noise or interference.

It will also be appreciated that whilst the invention has been described with reference to calculation on the basis of successive elapsed times after each event, i.e. the starting point of each sequence of events is the same and only the end point of the sequence is varied, the method and apparatus could be modified so that the end point rather than the starting point, or both the end point and the starting point are varied, provided that a suitable statistical data base is accumulated such as to permit substantial reduction of errors due to uncertainties in the temporal location of the starting and end points.

I claim:

1. Apparatus for determining the frequency of a cyclical component of a signal, comprising a signal source, filter means for receiving said signal and isolating said component, means for receiving said isolated component and dividing it at predetermined points in its cycle whereby to divide it into elements comprising an integral number of half cycles, an elapsed time counter means receiving said elements and outputting successive counts defining increments in total elapsed time corresponding to the successive elements, memory means receiving and storing said counts, a statistical calculator operative to receive said stored counts and provide an output proportional to a statistical means increment in total elapsed time, and read-out means operative to receive said output and provide a read-out of the frequency or period of said cyclical component of said signal, said statistical calculator being configured to determine a statistical mean increment such as to minimize the sum of the squares of the residuals of said successive total elapsed times as counted to the end of each element with respect to the corresponding incremental total elapsed times calculated on the basis of said mean.

2. Apparatus according to claim 1, wherein said statistical calculator is also operative to calculate an output related to the standard deviation of said times as counted from said mean, and said read-out means is operable to provide a read-out of said standard deviation related output.

3. Apparatus according to claim 1 or 2, wherein said filter means is a band-pass filter tunable in response to a control signal, and said output of said calculator provides said control signal.

4. Apparatus according to claim 1 or 2, wherein said signal source is a proton precession magnetometer.

5. Apparatus according to claim 1 or 2, wherein the signal dividing means includes a prescaling counter programmable to adjust the number of half cycles in an element so as to maintain the length of said elements within limits which are narrow relative to the range signal component frequencies to be determined.

6. Apparatus according to claim 1 or 2, wherein the counts stored by the memory represent sequential increments in total elapsed time corresponding to the length of said elements, including means to accumulate and average the counted increments in total elapsed time defined by counts from the counter and to subtract said average from the counts which are stored in the memory whereby to reduce the length of the words to be manipulated by the calculator.

7. Apparatus according to claim 2, including means to make the residuals of said incremental total elapsed time available for examination as a sequence.

8. Apparatus according to claim 1 or 2, including means to monitor the amplitude of said cyclical component and inhibit the generation of counts when said amplitude falls below a predetermined level.

9. Apparatus according to claim 1 or 2, wherein said elapsed time counter means counts pulses from a clock to measure successive increments in total elapsed time, the operation of the counter being synchronized to the clock whereby to avoid cumulative errors.

10. Apparatus according to claim 9, wherein the counter means comprises a non-synchronous ripple counter, and a synchronizer which interrupts pulses from the clock for a known interval between successive counts sufficient to allow ripple through, data output and resetting of the counter at the end of one count without disturbing a following count.

11. A method of determining the frequency of a cyclical component of a signal, comprising isolating said cyclical component, dividing said component into elements corresponding in length to an integral number of half cycles of said component, measuring the increment in total elapsed duration of the signal represented by each of said elements, storing data determinative of said incremented total elapsed durations, and determining a least squares approximation of the mean increment in total elapsed duration.

12. A method according to claim 11, further including the step of determining the standard deviation of said increments as measured with respect to said mean.

13. A method of measuring a magnetic field strength, comprising operating a proton precession magnetometer to provide output signal bursts including a cyclical component due to proton precession, amplifying each such burst and isolating therefrom said component, dividing that part of the component in each burst, occuring after an initial settling period and prior to the strength of the component falling below a predetermined level, into elements comprising an integral number of half cycles, measuring the increment in total elapsed duration of the signal represented by each of said elements, storing data determinative of said incremented total elapsed durations, and determining a least squares approximation and standard deviation of the mean increment in total elapsed duration.

* * * * *